(12) United States Patent
Bayerer et al.

(10) Patent No.: US 7,548,825 B2
(45) Date of Patent: Jun. 16, 2009

(54) METHOD AND APPARATUS FOR CURRENT AND TEMPERATURE MEASUREMENT IN AN ELECTRONIC POWER CIRCUIT

(75) Inventors: Reinhold Bayerer, Warstein (DE); Markus Thoben, Soest (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/622,727

(22) Filed: Jan. 12, 2007

(65) Prior Publication Data

US 2007/0176626 A1    Aug. 2, 2007

(30) Foreign Application Priority Data

Jan. 13, 2006   (DE) .................. 10 2006 001 874

(51) Int. Cl.
*G01K 15/00* (2006.01)
*G01R 31/14* (2006.01)

(52) U.S. Cl. .................. 702/99; 702/104; 702/105; 702/117; 324/765

(58) Field of Classification Search .................. 702/57, 702/64–69, 86, 117–123, 99, 107; 324/765, 324/769; 700/121; 713/500; 73/115, 115.01
See application file for complete search history.

(56) References Cited

U.S. PATENT DOCUMENTS

| | | | | |
|---|---|---|---|---|
| 5,805,131 A | * | 9/1998 | Hartmann et al. | 345/101 |
| 6,022,750 A | * | 2/2000 | Akram et al. | 438/18 |
| 6,334,093 B1 | * | 12/2001 | More | 702/99 |
| 2006/0086180 A1 | * | 4/2006 | Kassner | 73/115 |
| 2007/0234097 A1 | * | 10/2007 | Nervegna | 713/500 |

* cited by examiner

*Primary Examiner*—Eliseo Ramos Feliciano
*Assistant Examiner*—Phuong Huynh
(74) *Attorney, Agent, or Firm*—Dicke, Billig & Czaja, PLLC (57) ABSTRACT

A current/temperature measurement method using parasitic components in an electronic power circuit is disclosed. The measured values derived from these parasitic components with inadequate precision are first of all compensated for, in terms of their current/temperature or voltage dependence, during the production process. The evaluation which takes place during operation involves compensating for the temperature or current dependence of the sensor components using two measurements which are linearly independent of one another and appropriate arithmetic operations in an evaluation unit.

9 Claims, 10 Drawing Sheets

METHOD AND APPARATUS FOR CURRENT AND TEMPERATURE MEASUREMENT IN AN ELECTRONIC POWER CIRCUIT

CROSS-REFERENCE TO RELATED APPLICATIONS

This Utility Patent Application claims priority to German Patent Application No. DE 10 2006 001 874.5 filed on Jan. 13, 2006, which is incorporated herein by reference.

BACKGROUND

The invention relates to a method and an apparatus for current and temperature measurement in an electronic power circuit using parasitic components of the circuit.

The main representatives of electronic power circuits are three-phase converter circuits, whose core components are phase chips, known as half-bridges. Regulating the currents in the load which is connected to the converter usually requires a measurement in the phase outputs or in the positive or negative intermediate circuit. The measurement in the individual power switches, e.g., IGBTs, MOSFETs, diodes, thyristors, etc., is frequently and usually used only to protect against overcurrents. For this, the level of accuracy is permitted to be significantly worse than the accuracy for the measurement for regulating the currents.

For current measurement in electronic power circuits, precise shunt resistors, Hall sensors, magneto resistive sensors or similar current sensors have been usual to date. In these cases, an additional precise sensor component has had to be incorporated into the circuit. Such sensors are relatively expensive on account of the precision and require additional complexity for incorporation. In addition, they require evaluation electronics and, in the case of shunts, also potential isolators in the electronics.

It goes without saying that the need for current or temperature measurement exists not only for the three-phase converter circuits described by way of example above but also for other types of electronic power circuits or power semiconductor modules.

For these and other reasons, there is a need for the present invention.

SUMMARY

One embodiment provides a current/temperature measurement method using parasitic components in an electronic power circuit.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is illustrated by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

In one embodiment, a method and an apparatus for current and temperature measurement in an electronic power circuit or a power semiconductor module is provided such that the electronic power circuit equipped with the current and temperature measurement device does not become much more expensive, requires no additional complexity for incorporation and nevertheless allows precise current and temperature measurement.

In one embodiment, to implement the inventive method for current and temperature measurement, the proposed apparatus uses parasitic components of an electronic power circuit or of a power semiconductor module. The lack of precision therein is compensated for by calibration during the production process, e.g., during the electrical final check. The temperature and current dependence of the parasitic components used as sensors is achieved by means of two measurements which are linearly independent of one another and by means of appropriate arithmetic operations during the evaluation in the calibration process.

One embodiment provides a method for current/temperature measurement in an electronic power circuit, where a first sensor component and at least one second sensor component in the electronic power circuit are respectively used to detect a first current/temperature value or a first measured variable which is distinctly dependent thereon and at least one second current/temperature value or a second measured variable which is distinctly dependent thereon, where the first and the at least one second sensor component are chosen such that their voltage/current temperature characteristics are linearly independent of one another and at least one of the sensor components is a parasitic component of the electronic power circuit, wherein the variable measured using the first sensor component is calibrated on the basis of the measurement using the at least one second sensor component at least two different temperatures and different current values using a calibration process which takes place in an evaluation unit during the production process for the electronic power circuit, and an evaluation algorithm evaluates the measured values detected using the first sensor component during operation of the electronic power circuit in progress using parameters ascertained during the calibration process for compensating for the temperature and/or current dependence of the present measured values.

In one embodiment of the inventive current and temperature measurement method, the first sensor component and a single second sensor component may respectively be in the form of parasitic sensors which are independent of one another.

In another embodiment of the inventive current and temperature measurement method, the first sensor component may be in the form of a parasitic current sensor and a single second sensor component may be in the form of a precise additional temperature sensor.

In another embodiment of the inventive current and temperature measurement method, the first sensor component may be in the form of a precise current sensor and a single second sensor component may be in the form of a parasitic current sensor.

The calibration process involves the characteristics of the sensor components used being recorded during the production process for the electronic power circuit and being stored in the evaluation unit.

In another embodiment of the invention, a measurement apparatus for current/temperature measurement in an electronic power circuit which has a first sensor component and at least one second sensor component having voltage/current temperature characteristics which are linearly independent of one another, among which at least one sensor component is a parasitic component of the electronic power circuit and which are respectively able to be used to detect a first current/temperature value or a first measured variable which is distinctly dependent thereon and at least one second current/temperature value or a second measured variable which is distinctly dependent thereon, wherein an evaluation unit is also provided in order to calibrate the measured variable detected using the first sensor component on the basis of the measurement using the at least one second sensor component at least two different temperatures and different current values using a calibration process which takes place during the production process for the electronic power circuit and to take the parameters ascertained during the calibration process as a basis for compensating for the temperature and/or current dependence of the measured values detected using the first sensor component during operation of the electronic power circuit in progress.

The first sensor component and the at least one second sensor component are formed from highly heat resistant materials such that the characteristics of their properties used for the measurement do not change at continuous operating temperatures above a particular high temperature threshold value during the lifetime of the electronic power circuit.

This temperature threshold value is at least 150° C., preferably 175° C. and even more preferably 200° C.

In one embodiment, the inventive current and temperature measurement apparatus is used in a three-phase converter circuit of modular design in half-bridge configuration.

The evaluation unit is integrated in a half-bridge module in the three-phase converter circuit.

On the basis of the fundamental principle of the inventive method and of the inventive apparatus for current and temperature measurement, parasitic circuit components in a power semiconductor module or an electronic power circuit, such as parasitic resistors, e.g., conductor tracks, bonding wires, contact clips, connecting pieces, etc. in modules or else on busbars, parasitic temperature sensors, such as integrated gate resistors in the supply line to the control electrode for MOSFET switches, IGBT switches, etc., or other temperature-dependent variables in the electronic power circuit, such as the Miller plateau of MOS switches, the forward voltage of power semiconductors, conductor tracks, bonding wires etc., are used. A particular evaluation unit which differs from the evaluation electronics used for known sensors calibrates the imprecise parasitic circuit components used in the invention as sensor components during the production process for the power semiconductor modules or the electronic power circuits. This evaluation unit is integrated in the power semiconductor modules. The exact currents and voltages are ascertained by solving equation systems (algorithms) in the evaluation unit or in a control unit in the electronic power circuit or in the power semiconductor module. In this case, it is necessary to perform measurements using at least two sensor components, at least one of which, on the basis of the principle underlying the invention, has a parasitic presence. The sensor components need to have voltage/current/temperature characteristics which are linearly independent of one another. This is the case for aluminum, nickel or silicon, for example.

As an alternative to using two parasitic independent sensor components for current and voltage, a precise additional temperature sensor and a parasitic current sensor or a precise current sensor and a parasitic current sensor are used. In the case of the former application, the precise measured temperature is used to measure the current over the voltage drop across a parasitic resistor, e.g., a conductor track, a bonding wire etc., with the latter's temperature dependence being corrected by the precise temperature measurement during the evaluation by the evaluation unit.

Conversely, in the case of a precise current measurement using an additional precise current sensor, the temperature measurement is performed using a parasitic element and, by way of example, the voltage drop across conductor tracks, bonding wires etc. is used to determine temperature when the current is known. In this case, the current dependence in the current/temperature/voltage characteristic of the parasitic element is corrected during the evaluation by the evaluation unit.

The characteristics of the sensor components used are recorded during the production process for each module or each electronic power circuit and are stored in a processor which is present in the evaluation unit. They are then employed for current and temperature measurement resolved over time. Since these characteristics must not change, highly heat resistant materials are used for the sensor components. In particular, these materials are metals, semiconductors, silicon resistors, SiC. The design is chosen such that the materials in the surroundings of the sensor components used are resistant to continuous operating temperatures of at least 150° C., preferably at least 175° C., even more preferably at least 200° C., on account of their chemical composition over the lifetime of the module or the electronic power circuit. In this case, the properties used for the sensor components are maintained.

One embodiment provides a current/temperature measurement method using parasitic components in an electronic power circuit., e.g., a half-bridge circuit in a three-phase converter. The measured values derived from these parasitic components with inadequate precision are first of all compensated for, in terms of their current/temperature or voltage dependence, during the production process, e.g., during the electrical final check on the electronic power circuit. The evaluation which takes place during operation involves compensating for the temperature or current dependence of the sensor components using two measurements which are linearly independent of one another and appropriate arithmetic operations in an evaluation unit.

Figure 1:
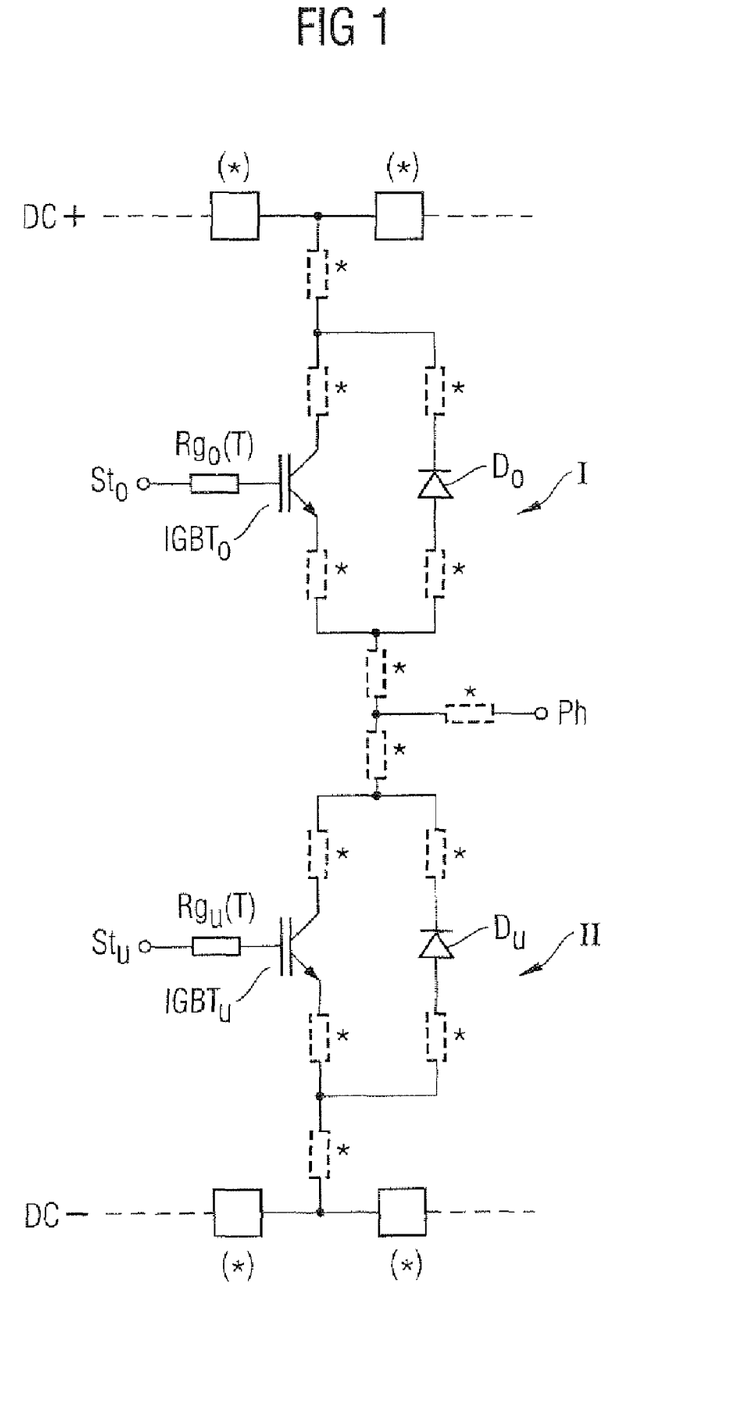
FIG. 1 schematically illustrates an equivalent circuit diagram of a half-bridge, as can be found in a three-phase converter circuit, for example, with the parasitic resistors which can be used for the inventive current and temperature measurement method being indicated.

In FIG. 1, an asterisk symbol (*) indicates parasitic resistors R(I,T) which can be used for inventive current/temperature measurement in a half-bridge which forms part of a three-phase converter circuit in an electronic power circuit. This half-bridge circuit has an upper branch I with an upper power semiconductor switch IGBTo, an upper gate resistor Rgo(T) and an upper freewheeling diode Do and also a lower half-bridge branch II with a lower power semiconductor switch IGBTu, a lower gate resistor Rgu(T) and a lower freewheeling diode Du. An upper control connection is denoted by STo and a lower control connection is denoted by STu, the positive connection is denoted by DC+, the negative connection is denoted by DC− and the phase output is denoted by Ph. All the parasitic resistors provided with an asterisk symbol can be used for the inventive current/temperature measurement method. The temperature-dependent integrated gate resistors Rgo(T) and Rgu(T) can be used as parasitic temperature sensors.

Figure 2:
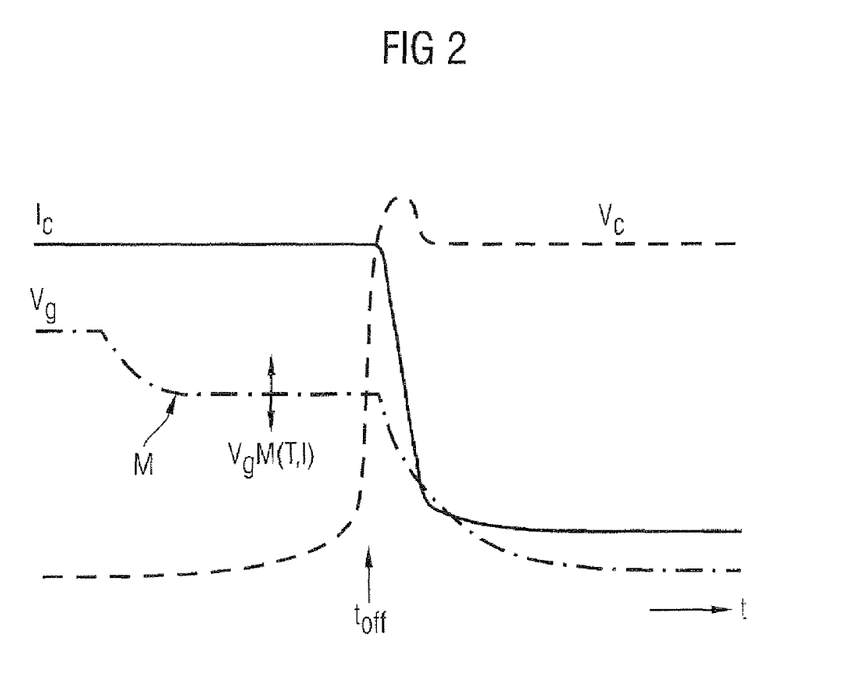
FIG. 2 graphically illustrates current and voltage profiles for the turn-off operation of an IGBT connected to an inductive load.

FIG. 2 graphically illustrates current and voltage profiles which vary over time for an IGBT at the turn-off time $t_{off}$, specifically a solid line showing the collector current Ic, which falls abruptly at the turn-off time $t_{off}$, a simple dashed line showing a collector voltage Vc, which rises abruptly at the turn-off time $t_{off}$, and a dash-dot line showing the gate voltage Vg, whose Miller plateau M has a temperature-dependent and usually also current-dependent threshold voltage VgM(T,I), as indicated by a double-headed arrow. In the case of the inventive current/temperature measurement method, the threshold voltage VgM(T,I) indicated in FIG. 2 can be used as a parasitic sensor component, since it is a temperature-dependent voltage. Parasitic sensor components which can be used for current and temperature measurement are the parasitic resistors indicated in FIG. 1, such as conductor tracks, bonding wires, contact clips, connecting pieces etc. in modules and busbars, parasitic temperature sensors such as integrated gate resistors in the supply lien to the control electrode of MOSFETs, IGBTs or, as mentioned above, the temperature-dependent threshold voltage VgM(T) of the Miller plateau of an IGBT as illustrated in FIG. 2. In addition, the current- and temperature-dependent forward voltage of power semiconductors, of conductor tracks, bonding wires etc. can be used as parasitic sensor components.

The current dependence of the threshold voltage VgM(T,I) means that it may also be necessary to perform calibration for this current dependence.

Figure 3:
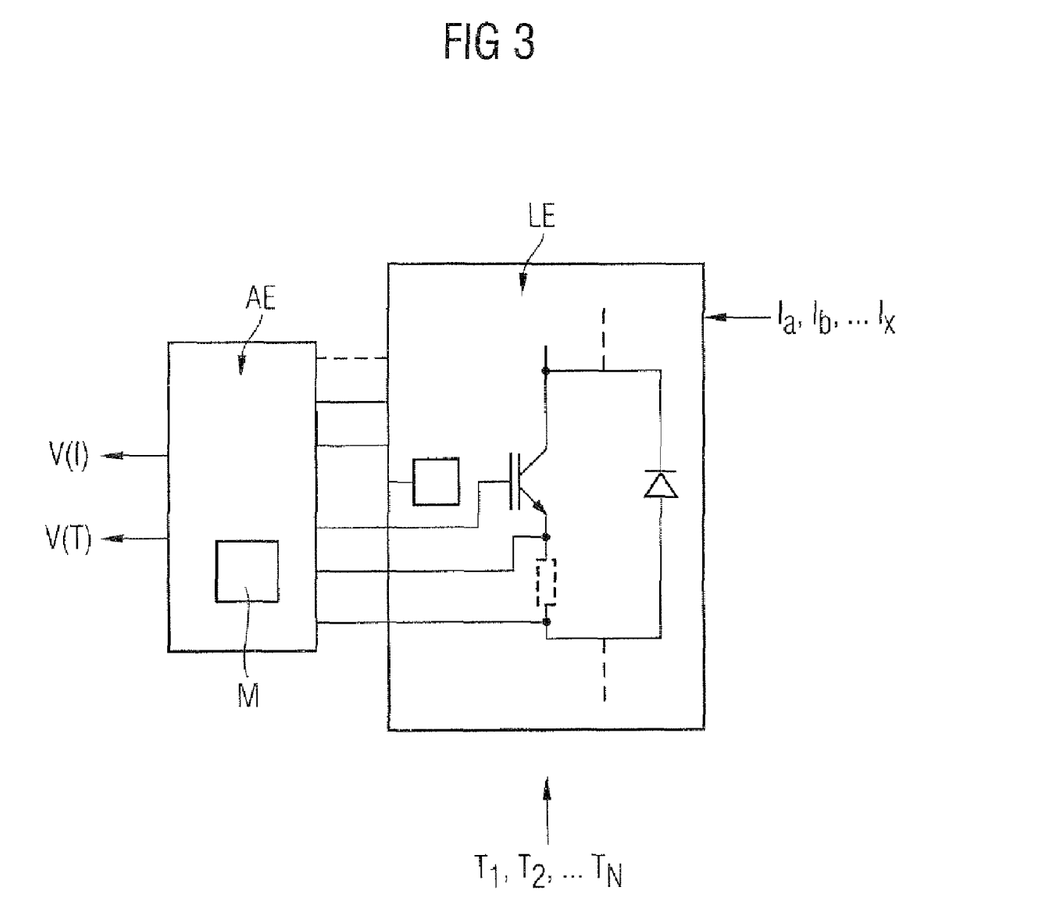
FIG. 3 schematically illustrates the coupling of an evaluation unit used for the calibration process of the inventive method to an electronic power circuit.

FIG. 3 illustrates an evaluation unit AE which contains arithmetic and memory means M and which is connected or can be connected to an electronic power circuit LE. Derivations from parasitic and/or precise sensor components in the electronic power circuit, in this case LE, e.g., from a parasitic emitter resistor and an integrated gate resistor, are routed to the evaluation unit AE. The evaluation unit AE is integrated in a module of the electronic power circuit. During the production process for the electronic power circuit LE, this or the sensor component to be calibrated is brought to at least two different temperatures T1, T2, ..., Tn in a heating chamber, on hot plates or the like, and is then subjected to various currents Ia, Ib, ..., Ix in pulsed fashion at each temperature T1, T2, ..., Tn. The pulse widths of the currents are in this case proportioned such that the current loading does not result in any significant temperature change for the parts which are to be calibrated, in this example for the parasitic resistor in the emitter supply line of the IGBT. For each temperature and current process, the voltage drops across the sensor components are measured. These are used to ascertain the equations in the evaluation unit AE. Normally, the form of the equations V(I) and V(T) is already prescribed and it is now merely necessary to determine parameters for these equations during the calibration process.

The fully determined two equations are then stored in the memory means M and are also retained when the electronic power circuit LE has been turned off.

The calibration operation outlined is also performed with the evaluation unit AE, e.g., a controller, integrated in the module of the electronic power circuit LE. To this end, a specific mode is programmed into it.

During operation of the electronic power circuit LE, the measured values taken from the sensor components (e.g., two voltages in the range of typically 0 to 5 volts) are read into the evaluation unit AE or the controller and are converted into a temperature value and a current value using an algorithm.

These results are then processed further in the usual way. Typical computation times for ascertaining currents are in the range from 50 µs to 3 ms.

Figure 4:
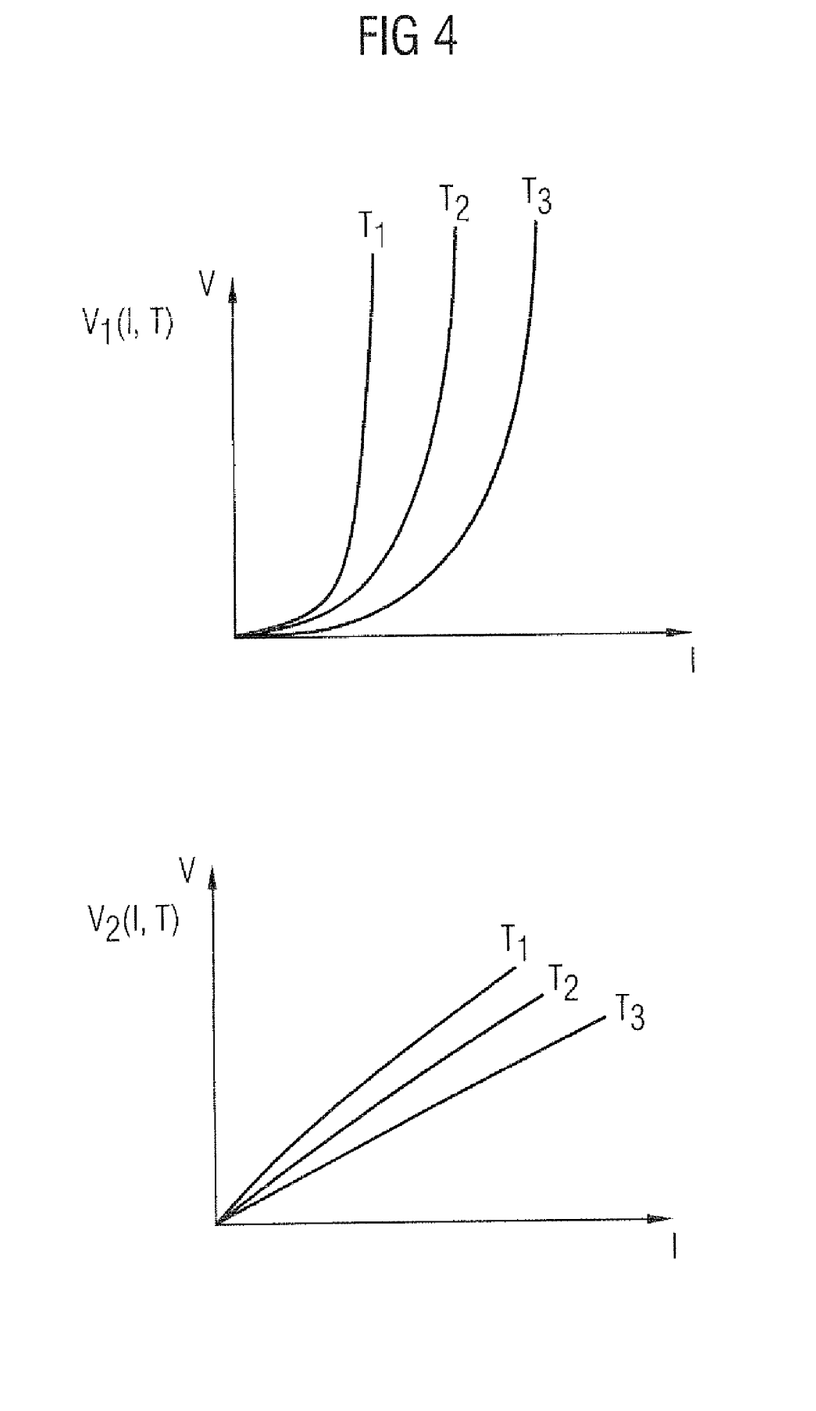
FIG. 4 graphically illustrates examples of voltage/current/temperature characteristics which are linearly independent of one another in the case of two different sensor components which may be used for the inventive method.

FIG. 4 graphically illustrates two examples of voltage/current/temperature characteristics V1(I,T) and V2(I,T) which are linearly independent of one another, as are required for the two sensor components in the inventive measurement method.

Figure 5:
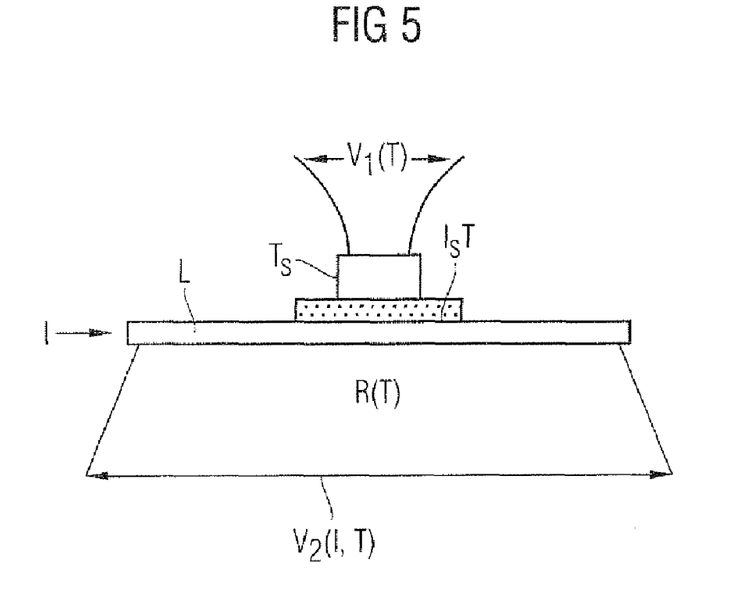
FIG. 5 schematically illustrates a cross section through a precise temperature sensor which has been put onto a conductor track with the interposition of an insulating support.

FIG. 5 schematically illustrates a first exemplary embodiment of an inventive current measurement method in which the current is measured using a conductor track L in the module of the electronic power circuit, e.g., a copper track on a ceramic substrate. In this case, the conductor track L with the temperature-dependent resistor R(T) assumes the same temperature T as the underlying ceramic substrate, and the conductor track L can be used to tap off a voltage V2(I,T) which is dependent on the current I flowing through it and on the temperature T. The temperature is measured using a temperature sensor which is present in the module anyway, or as in this case a precise temperature sensor TS is placed directly on the conductor track L with the interposition of an insulating support IST. The current/temperature characteristic of the voltage drop V2(I,T) across the conductor track L is calibrated using the temperature sensor TS on it and is stored in the processor in the evaluation unit AE (cf. FIG. 3), in particular is burned in. The temperature T measured exactly by the temperature sensor TS during operation of the electronic power circuit is used to correct the current measurement:

$$V1(T) \longrightarrow T = T(V1)$$
$$V2(I,T) \longrightarrow V2(I,T(V1))$$
$$V2 = f(I,V1) \longrightarrow I = f(V2, V1).$$

Here, V1, V2 are the measured variables, and the current I is ascertained on the basis of the two measured variables V1, V2 by calculating it from the above relationship.

Figure 6A:
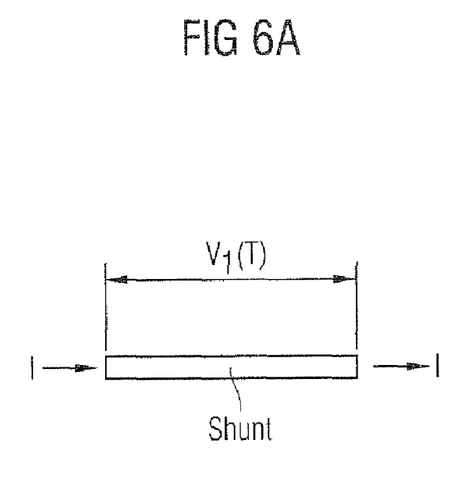
FIGS. 6A, B schematically illustrate a precise current sensor in the form of a shunt, where the same current flowing through the precise current sensor also flows via a contact conductor which connects a power semiconductor chip.
Figure 6B:
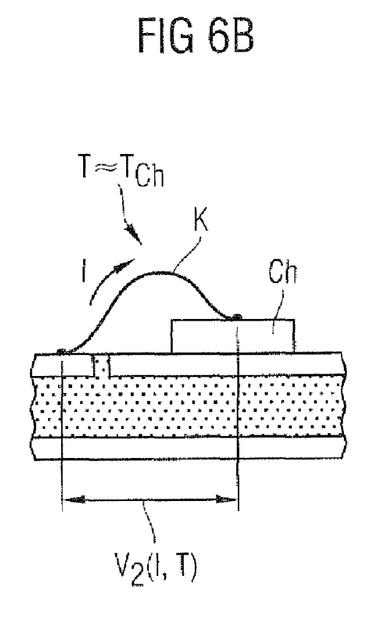

FIGS. 6A and 6B illustrate a second exemplary embodiment of the inventive current/temperature measurement method. To obtain a precise measurement of the current, the electronic power circuit or the module contains an additional shunt. This is used to measure the current I independently of temperature using the voltage V1(I) which drops across the shunt. The measured current I also flows via a chip contact K, e.g., a bonding wire, a clip etc., which is thermally coupled to a power semiconductor chip Ch, i.e. the following is true: $T_K \approx T_{Chip}$. Hence, V2(I(V1)T) also applies to the temperature- and current-dependent voltage drop V2(I,T). The calibrated and stored current/temperature/voltage characteristic can be used with a precisely measured current value to ascertain the temperature of the chip Ch through calculation on the basis of the relationship T=f(V1,V2). This calculation takes place in the evaluation unit AE (cf. FIG. 3).

Figure 7A:
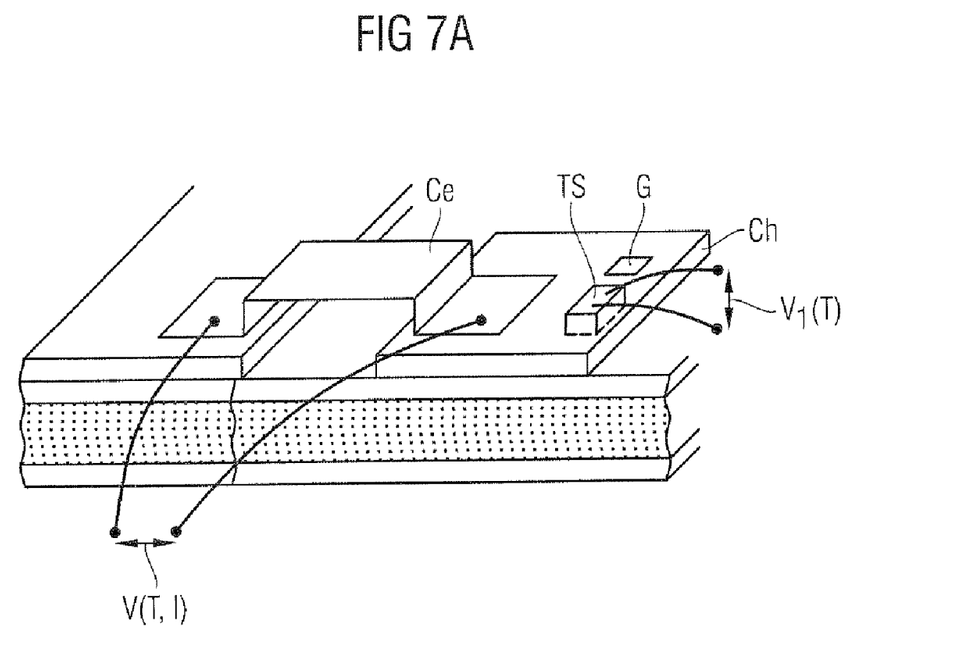
FIG. 7A perspectively and schematically illustrates a precise temperature sensor which has been put onto a power semiconductor chip or is integrated therein and which is used to correct the current measurement in a connecting clip which forms a parasitic sensor component.

In a third exemplary embodiment of the inventive current/temperature measurement method, which is illustrated in FIG. 7A, temperature measurement is performed using a precise temperature sensor TS which is integrated in the chip Ch or which is placed on the chip. To measure the current, this exemplary embodiment involves the use of a clip C1 routed to the top of the power semiconductor chip Ch. Instead of the clip C1, this may also be a bonding wire, a conductor track or a metallization on the chip. The current- and/or temperature dependent voltage V(T,I) which drops across the clip C1 is compensated for in terms of temperature using the temperature-dependent voltage V1(T) measured by the temperature sensor TS.

Figure 7B:
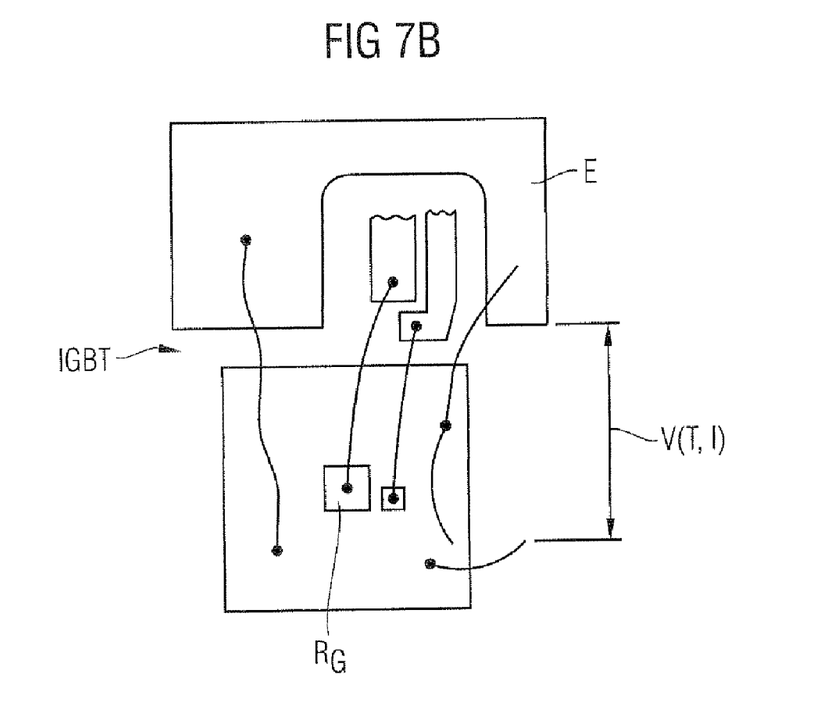
FIG. 7B illustrates a schematic plan view of an integrated gate resistor for temperature measurement which is provided in a power semiconductor chip, the integrated gate resistor being able to be evaluated using a parasitic pad.

In line with a fourth exemplary embodiment of the inventive current/temperature measurement method, which is illustrated in FIG. 7B, temperature measurement is performed using an integrated gate resistor $R_G$ which is provided in the chip and which can be evaluated using a parasitic pad. The gate resistor $R_G$ is used for continuously sending a measured current. The current source is connected on a floating basis to the gate electrode of the power semiconductor switch. The voltage drop V is measured during the quiescent phase of the gate charging and discharge current ($I_G$=0) for switching and is supplied to a temperature evaluation stage in the evaluation unit. To this end, the temperature measurement is masked out during the switching operations with an idle time therefor (e.g., 1 to 10 ms). In the case of this current/temperature measurement method, the following applies to the integrated gate resistor $R_G$:

$$R_G(T) \longrightarrow T(R_G)$$
$$V(I,T) \longrightarrow V(I,T(R))$$
$$I = f(R_G, V)$$

$R_G$ and V are ascertained by means of measurement on the sensor components and I is evaluated by means of calculation.

Figure 8:
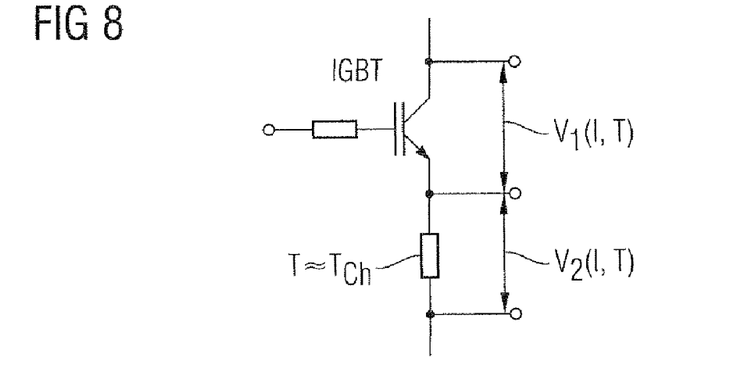
FIG. 8 illustrates two parasitic sensor components in a power semiconductor, firstly an IGBT's current/voltage characteristic used for temperature measurement and a current/voltage sensor in the form of a parasitic emitter resistor.

A fifth exemplary embodiment of the inventive current/temperature measurement method is illustrated schematically in FIG. 8. In this case, temperature measurement is performed using the chip's current/voltage characteristic of the voltage V1(I,T) which drops across an IGBT and which is additionally temperature-dependent. However, this voltage has a severely nonlinear characteristic which is sufficiently different than the temperature dependence of the current sensor. Therefore, a second relationship V2(I,T), which is non-linearly dependent on the current/voltage characteristic of the IGBT, exists for the parasitic resistor used as current sensor in the emitter line of the IGBT, it being assumed that the temperature T of the parasitic resistor in the emitter supply line of the IGBT is approximately the same as the chip temperature $T_{ch}$ of the IGBT. Both relationships V1(I,T) and V2(I,T) can be resolved using an algorithm, where T1=T2 and I1=I2. The currents are therefore the same in both sensor components because the same current flows in the emitter supply line (sensor component) to the IGBT as in the IGBT.

Figure 9A:
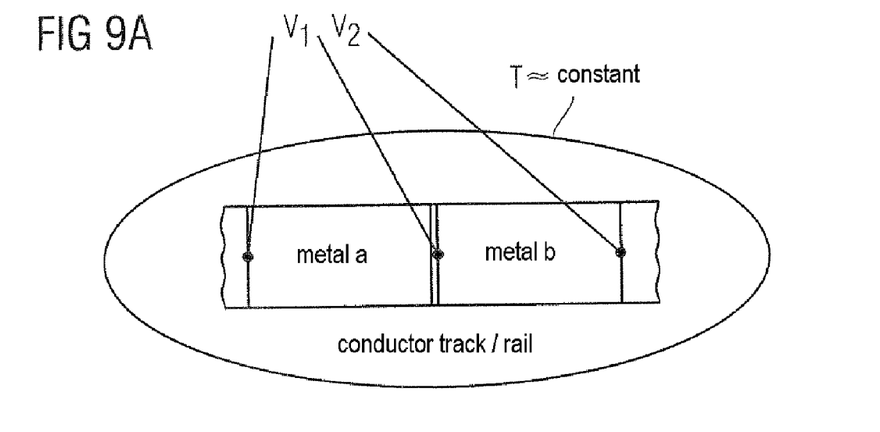
FIG. 9A schematically illustrates two metals, provided in a conductor track/busbar, with a different temperature coefficient in the same current path, these being able to be used as first and second sensor components which are independent of one another.

In a sixth exemplary embodiment of the inventive current/temperature measurement method, which is illustrated schematically in FIG. 9A, two different metals with different temperature coefficients, i.e. metal a and metal b, are used in a single current path. This current path may be a conductor track in the module of the electronic power circuit or a busbar in a three-phase converter circuit. Both metals, metal a and metal b, are at the same temperature (T is approximately constant) during operation. A measurement is taken for the voltages V1(I,T) and V2(I,T) which respectively drop across metal a and metal b. When the individual characteristics have been calibrated in the calibration process, the current I and the temperature T are obtained during operation from the evaluation of the two measured voltages.

Figure 9B:
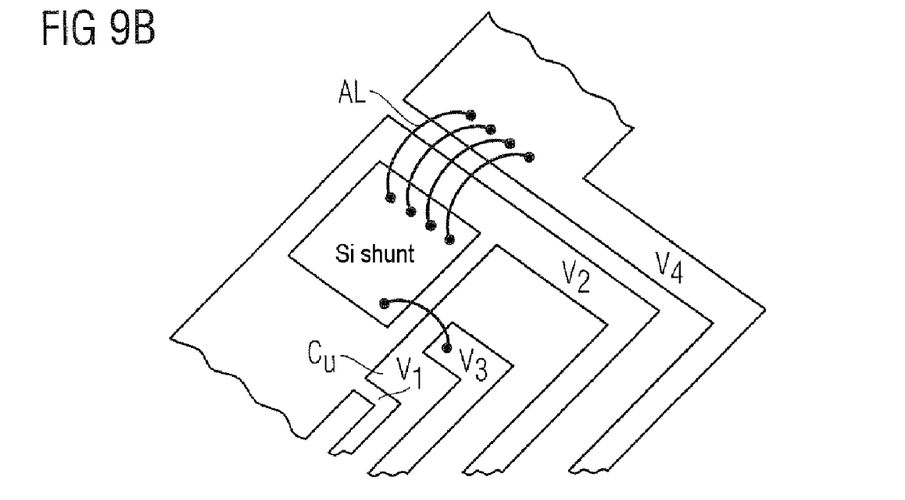
FIG. 9B illustrates, in similar fashion to FIG. 9A, different materials with a different temperature coefficient in the same current path which are able to be used for temperature and current measurement in the inventive method.

In a seventh exemplary embodiment of the inventive method, which is illustrated in FIG. 9B, different materials with a respective different temperature coefficient are used in a single current path, as in FIG. 9A. Both materials are at the same temperature during operation. One material is an Si shunt, which has a very different temperature coefficient from the other materials such as Al or Cu. Either the voltage V1 or V4 is detected in addition to the voltages V3 and V2, or all the voltages V1, V2, V3 and V4 are measured. The individual characteristics are calibrated and, during operation, the current and temperature are obtained from the evaluation of the measured voltages.

Figure 10:
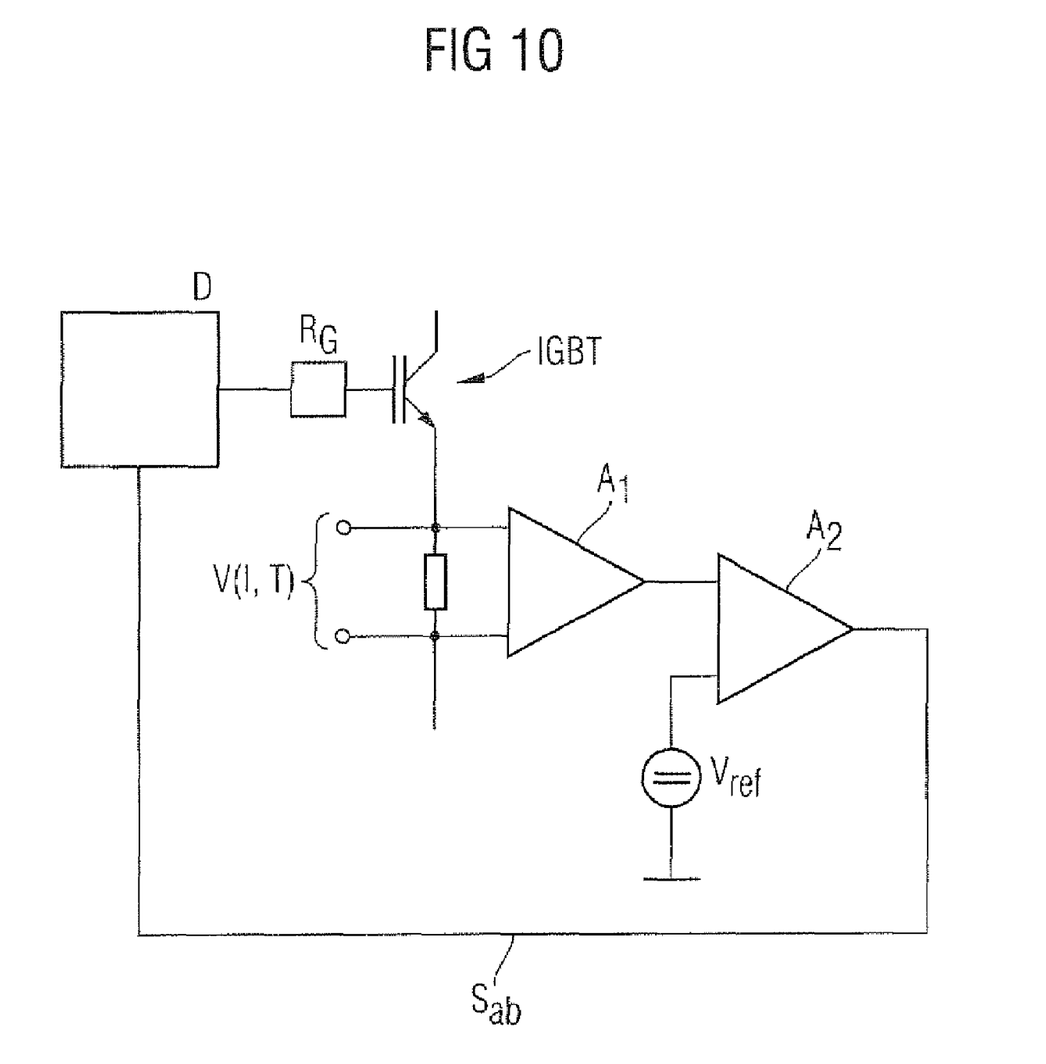
FIG. 10 schematically illustrates an exemplary embodiment of current and temperature measurement using a parasitic resistor situated in the emitter line of an IGBT.

In an eighth exemplary embodiment of the inventive current/temperature measurement method, which is illustrated in FIG. 10, the current in the emitter supply line to a power semiconductor switch IGBT is evaluated using the current- and temperature-dependent voltage drop V(I,T) across a parasitic resistor in the emitter supply line. Rapid protection of the power semiconductor switch IGBT can be achieved by firstly measuring the current imprecisely in direct fashion, i.e. without temperature compensation. To this end, the voltage drop which is tapped off across a first amplifier A1 is compared in a second amplifier A2 directly with the reference voltage Vref, and the subsequently produced signal Sab is supplied to a driver circuit D with a protection function for turning off. In parallel with this, the current- and temperature-dependent voltage drop V(I,T) is supplied to an evaluation unit for the purpose of precise and temperature-compensated current measurement. It should be noted that the further sensor component provided for the inventive temperature compensation may be the integrated gate resistor $R_G$. The inventive evaluation operation for precise current measurement in the evaluation unit proceeds more slowly than the indirect turn-off by the signal Sab. In a similar manner to the direct turn-off operation described above with reference to FIG. 10, a parasitic temperature sensor without correction can also be used directly for over temperature measurement and turn-off.

Figure 11:
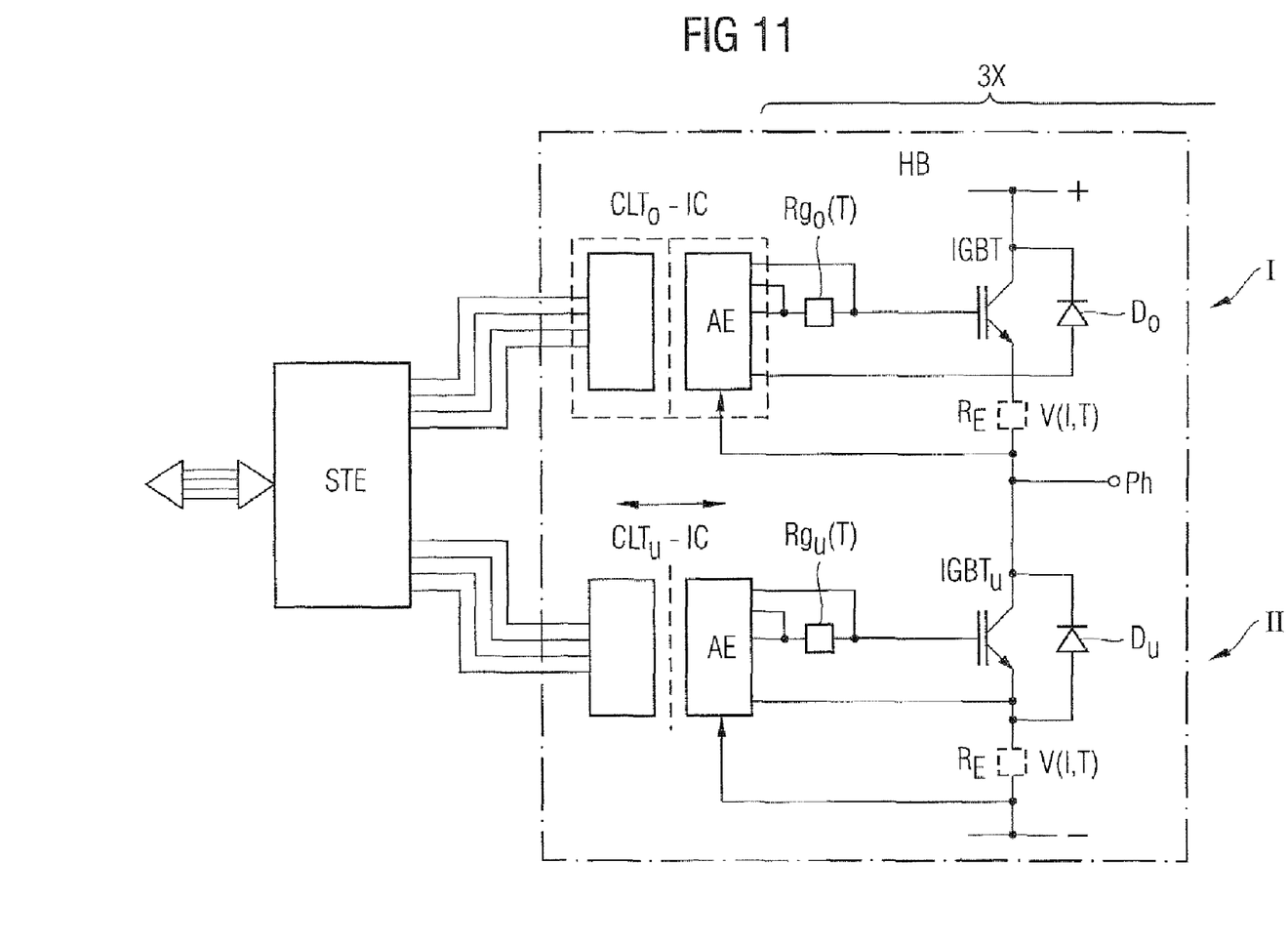
FIG. 11 illustrates a circuit diagram of a module of a three-phase converter circuit which incorporates a half-bridge and an actuating circuit, containing a coreless transformer, and in which the inventive current/temperature measurement method is implemented.

In a ninth exemplary embodiment illustrated in FIG. 11, a half-bridge circuit HB is designed as illustrated in FIG. 1, for example. In this case, a first parasitic resistor $R_E$ in the emitter supply line for the upper IGBTs IGBTo and a parasitic resistor $R_E$ in the emitter supply line for the lower IGBTs IGBTu in the half-bridge circuit HB are used as first parasitic sensor components which are respectively used to tap off a current- and temperature-dependent voltage drop V(I,T) for the inventive current measurement and to supply it to an evaluation unit AE. For the purpose of temperature compensation, the respective voltage drop in the integrated gate resistor Rgo and Rgu in the upper half-bridge branch I and in the lower half-bridge branch II is supplied to the evaluation unit AE. The evaluation unit AE is integrated in the actuating circuit in the half-bridge circuit HB and has an interface to an external or integrated control unit STE. Similarly, FIG. 11 indicates that the actuating circuit with the evaluation unit AE is a respective integrated circuit CLTo-IC or CLTu-IC with a coreless transformer integrated on the chip (sigma-delta converter with coreless transformer for potential isolation).

Depending on requirements, the precise evaluations may take up to 100 ms. The converter, which contains three such half-bridge circuits HB, then performs averaging over entire sinusoidal periods of the output currents on the phase outputs Ph. This is permissible because the converter regulation relates to the currents averaged over at least one half-cycle, and the time constants of converters or converter modules vary in the range of>100 ms for serious changes in the chip temperatures.

So far as the sensor components used for the inventive current/temperature measurement method are at the potential of the associated power semiconductors, the measured voltages are transmitted uncorrected via potential isolation points to the control unit STE for the appliance. There, the characteristics measured during the calibration operation in the production process are stored, and the measured values are evaluated in relation thereto. There, the measured temperatures are used for early warning and power limiting in the appliance and for protection turn-off, for example. The measured current values are used to regulate the appliance and also to limit overloads.

Alternatively, the nonfloating measured values can be processed by the evaluation unit AE in the actuation circuit respectively formed from CLTo-IC and CLTu-IC, can be transferred via the potential interface of the actuation circuit to the primary side thereof and can be forwarded from there to the control unit STE. Optionally, simple field programmable gate arrays (FPGA) are used for this purpose.

Figure 12:
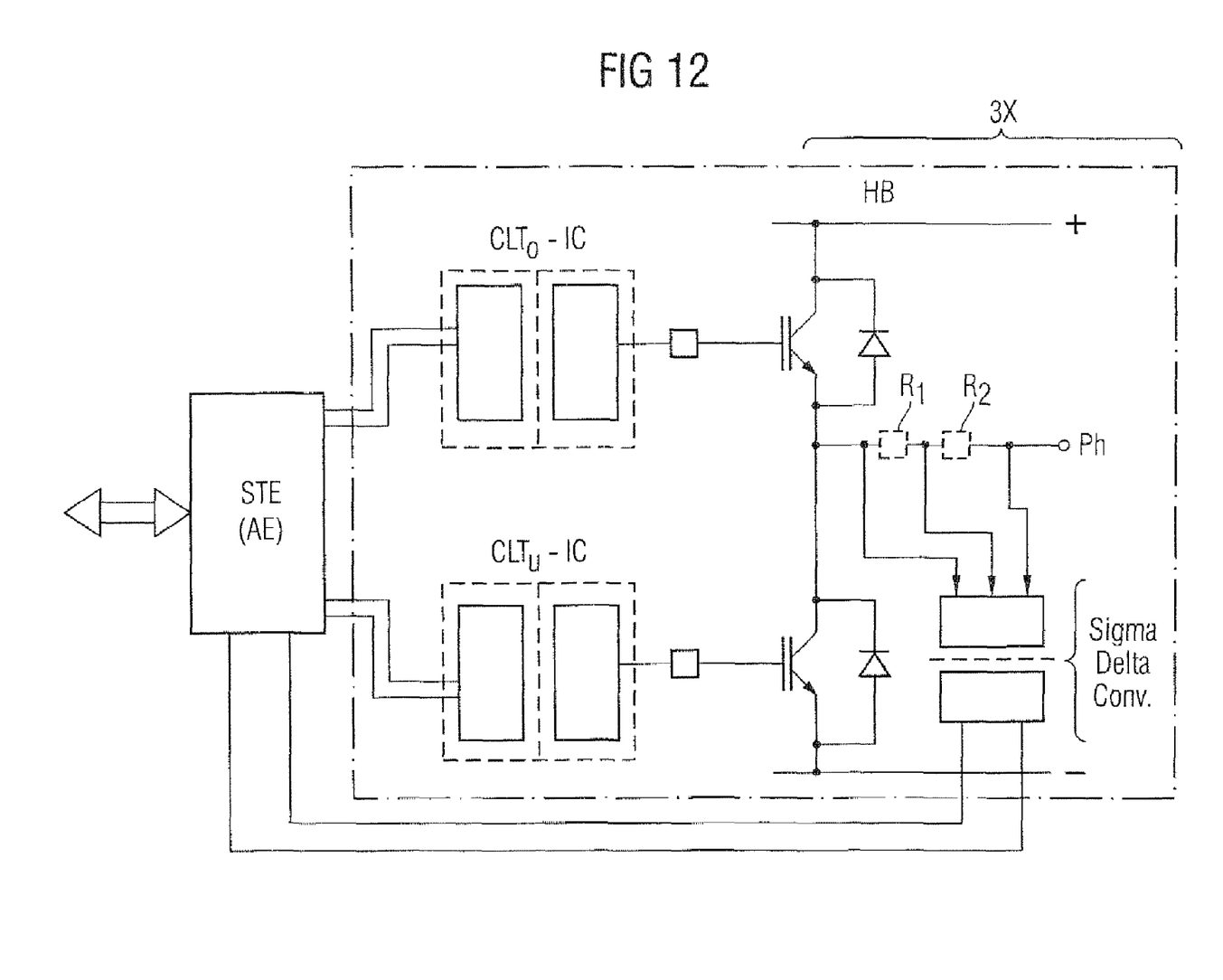
FIG. 12 illustrates a second exemplary embodiment of an implementation of the inventive current/temperature measurement method in a single module of a three-phase converter circuit, the module incorporating a half-bridge and an actuating circuit containing a coreless transformer.

In the tenth exemplary embodiment, illustrated in FIG. 12, of a half-bridge circuit HB which is equipped with an inventive current/temperature measurement apparatus and which has integrated upper and lower actuating circuits CLT-IC which use coreless transformers integrated on the chip, two parasitic resistors $R_1$, $R_2$ in the conductor routed to the phase output Ph, which have voltage/current/temperature characteristics which are linearly independent of one another (e.g., two different metal sections metal a and metal b as illustrated in FIG. 9A), transfer derived measured variables via a sigma-delta converter to a control unit STE which contains the evaluation unit required by the invention. In the rest of the circuit details, the exemplary embodiment illustrated in FIG. 12 is similar to the exemplary embodiment illustrated in FIG. 11, which is why the circuit details are not described again at this juncture.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for current/temperature measurement in an electronic power circuit, comprising:

using a first sensor component and at least one second sensor component in the electronic power circuit to respectively measure a first current/temperature value or a first variable value which is distinctly dependent on the first current/temperature value and at least one second current/temperature value or a second variable value which is distinctly dependent on the second current/temperature value, wherein the first and the at least one second sensor component respectively have voltage/current temperature characteristics which are linearly independent from one another and wherein at least one of the sensor components is a parasitic component of the electronic power circuit; and during operation of the electronic power device, calibrating a first current/temperature value or first variable value measured by the first sensor component on the basis of current/temperature measurements by the at least one second sensor component at least two different temperatures and different current values using a calibration process which takes place during a production process of the electronic power circuit, wherein the first current/temperature value or first variable value measured by the first sensor component is adjusted using parameters ascertained during the calibration process to compensate for the temperature and/or current dependence of the measured first variable value.

2. The measurement method as claimed in claim 1, comprising:
   forming the first and a single second sensor component as parasitic sensors.

3. The measurement method as claimed in claim 1, comprising:
   forming the first sensor component as a parasitic current sensor and forming a single second sensor component as a precise additional temperature sensor.

4. The measurement method as claimed in claim 1, comprising:
   forming the first sensor component as a precise current sensor and forming a single second sensor component as a parasitic current sensor.

5. The measurement method as claimed in claim 1, comprising forming the first sensor component and the at least one second sensor component from highly heat resistant materials such that the characteristics of their properties used for the measurement do not change at continuous operating temperatures above a particular high temperature threshold value during the lifetime of the electronic power circuit.

6. The measurement method as claimed in claim 5, comprising wherein the temperature threshold value is at least 150° C.

7. The measurement method as claimed in claim 5, comprising wherein the temperature threshold value is at least 175° C.

8. The measurement method as claimed in claim 5, comprising wherein the temperature threshold value is at least 200° C.

9. The measurement method as claimed in claim 1, comprising wherein the calibration process involves the characteristics of the sensor components used being recorded during the production process for the electronic power circuit and being stored in the evaluation unit.

* * * * *